United States Patent [19]
Jelinek

[11] Patent Number: 6,143,147
[45] Date of Patent: Nov. 7, 2000

[54] WAFER HOLDING ASSEMBLY AND WAFER PROCESSING APPARATUS HAVING SAID ASSEMBLY

[75] Inventor: Vaclav Jelinek, River Edge, N.J.

[73] Assignee: Tokyo Electron Limited, Tokyo, Japan

[21] Appl. No.: 09/183,503

[22] Filed: Oct. 30, 1998

[51] Int. Cl.[7] ........................... C23C 14/34; C23C 16/00; B05C 13/00; B65H 1/00; C23F 1/02
[52] U.S. Cl. .................... 204/298.15; 118/728; 118/500; 118/503; 414/225; 156/345
[58] Field of Search .................. 204/298.01, 298.02, 204/298.15; 118/728, 715, 500, 503; 156/345; 279/71, 72; 257/718; 414/225

[56] References Cited

U.S. PATENT DOCUMENTS

| | | | |
|---|---|---|---|
| 4,915,564 | 4/1990 | Eror et al. | 414/225 |
| 5,192,087 | 3/1993 | Kawashima et al. | 118/503 |
| 5,372,612 | 12/1994 | Cronin, et al. | |
| 5,460,703 | 10/1995 | Nulman et al. | 204/298.15 |
| 5,664,988 | 9/1997 | Stroupe et al. | 451/41 |
| 5,810,931 | 9/1998 | Stevens et al. | 204/298.15 |
| 5,820,329 | 10/1998 | Derbinski et al. | 414/225 |
| 5,825,089 | 10/1998 | Valenti et al. | 257/718 |

FOREIGN PATENT DOCUMENTS

| | | |
|---|---|---|
| 0 343 502 | 11/1989 | European Pat. Off. . |
| 739 056 A2 | 10/1996 | European Pat. Off. . |
| 7 114 789 | 12/1993 | Japan . |

*Primary Examiner*—Nam Nguyen
*Assistant Examiner*—Gregg Cantelmo
*Attorney, Agent, or Firm*—Wood, Herron & Evans, L.L.P.

[57] ABSTRACT

A wafer holder is provided for semiconductor wafer processing that is particularly useful where wafers are held and moved in other than upwardly facing orientations during handling and processing. The holder includes an annular wafer mounting ring that is resiliently mounted to and biased against an annular wafer holder housing. A set of latches is pivotally mounted to the mounting ring. The latches are formed of non-metallic latch bodies and have non-metallic front and back rollers thereon which have rolling peripheries that roll over the surface of the mounting ring, along a circular path on which are formed spherical detents. The rolling peripheries of the rollers conform to the curvature of the detents. The front roller also has a gripping periphery at the outer edge thereof that rolls onto the edge of a wafer held in the holder against the edge of the mounting ring. The mounting ring forms a seal with the backplane of the processing apparatus to prevent plasma from forming around the latches. The mounting ring also registers against a stop to space the wafer from the backplane to protect the device side of the wafer when backside wafer processing is being carried out.

34 Claims, 3 Drawing Sheets

WAFER HOLDING ASSEMBLY AND WAFER PROCESSING APPARATUS HAVING SAID ASSEMBLY

This invention relates to high vacuum processing and particularly the handling and holding of wafers, particularly semiconductor wafers, for such high vacuum processing. More particularly, this invention relates to the avoidance of wafer damage, particulate contamination and other problems that arise in semiconductor device manufacturing processes in the handling and holding of semiconductor wafers in semiconductor wafer processing equipment.

BACKGROUND OF THE INVENTION

In semiconductor manufacturing processes such as, for example, the sputtering of thin films onto substrates such as silicone or gallium arsenate wafers, it is usually necessary to transfer wafers among different process chambers. In some systems, wafers are transferred in a horizontal plane where the wafer typically rests on a transfer arm resembling a paddle. The gravitational force on the wafer and the resulting friction between the wafer and the underlying supporting element, combined with controlled acceleration of the wafer on the support element, makes possible the use of clamp-free wafer transfer. In some systems, however, for process related and other reasons, wafers are moved in non-horizontal orientations or held in non-horizontal orientations during processing. In such systems, the wafer is locked to and carried by a device called a wafer holder that is equipped with clamping structure or other locking elements to hold the wafer in position on the holder.

The locking device of a wafer holder is typically referred to as a latch. The latch exerts pressure on the wafer to lock the wafer in a fixed position on the holder. With certain spring biased latches, for example, the latches exert pressure against a wafer, which is supported by the multitude of independent tabs or by a wafer mounting ring. Friction force between such elements and the wafer prevents the wafer from slipping during the motion of the wafer holder.

Some wafers of which semiconductors are made are very fragile, either because of their small thicknesses or because of the nature of the substrate material of which they are made, for example, gallium arsenate wafers, which are particularly fragile. In the final stages of device fabrication, a large number of nearly completed semiconductor devices on a wafer adds substantial value to the basic wafer, however, making such wafers very expensive. Any breakage of a wafer at such later stages of fabrication represents a substantial economic loss and contributes a substantial cost to semiconductor device manufacturing. Poor function or reliability of the latches that retain the wafers to the holders can result in such breakage as well as increase the equipment down-time and a loss of equipment throughput. Further, rough operation of the latches can cause the production of particulates in the vacuum chamber causing contamination of the wafer, which can interfere with the fabrication of semiconductor devices and result in the production of defective devices.

High vacuum systems are widely used in technical and commercial applications such as semiconductor device manufacturing processes, which require the performance of the particular process in the absence of air and airborne contaminants. An example of such a process is the sputter deposition of thin films onto silicon wafers, or substrates, in the manufacture of integrated circuit chips. With the ongoing trend toward device miniaturization in semiconductor manufacture where device features are currently assuming sub-micron dimensions and with integrated circuits increasing in functional size, complexity and value, particles of a size and quantity heretofore tolerable in semiconductor manufacture are now capable of causing damage that can totally destroy expensive devices and, therefore, are no longer tolerable.

Still further, in the process of manufacturing semiconductor devices on silicon wafers, there are applications in which a need often exists for sputtering onto the back side of the wafer. For example, gold is sometimes applied on the back of wafers to facilitate heat removal from the chip. Where front side sputtering is taking place, the back side of the wafer is typically sealed against a heating surface built into the wafer holder. During backside sputtering, however, the front side of the wafer, which contains the devices being manufactured, must not touch the backplane.

Wafer holder latches act in concert with the physical elements that define the mounting plane of the wafer holder on which the wafer rests to clamp the wafer between the latches and those elements on the wafer holder. Such latches may include, for example, flexible tabs or a suitable wafer mounting ring. The holders include an appropriate wafer exposure opening to permit etching or sputtering of the wafer. In the prior art wafer holders, the interaction of the latches and the mounting plane structure has produced a number of the problems discussed above.

The holder of the wafer clamping device typically consists of a multitude of flexing tabs and a plurality of latches, for example, three latches, mounted to the wafer holder housing. The flexible tabs define a wafer mounting plane on which the wafer rests. When the wafer is loaded onto the wafer holder, a load arm of a robot typically positions the silicon wafer against the tabs in a precise and repeatable manner so as to minimize chipping and provide reliable wafer latching. The wafer is held in place on the holder with friction generated, for example, by spring loaded rollers forcing the wafer against two adjacent tabs. The force applied by such rollers deflects the wafer locally a small amount in accordance with the thickness of the wafer. Thinner and more flexible wafers tend to induce less friction against the tabs and have a greater tendency to slide during acceleration. If such sliding happens to position a tab at or near the edge of a wafer, wafer chipping can result, particularly when the wafer is sealed against a backplane.

The latch itself can cause problems. The major components of a typical latch assembly are the body of the latch with a front roller and one or more rear rollers mounted opposite the front roller or to its sides. The term "front" roller refers herein to a roller that rolls against a wafer to latch the wafer to a holder, and the terms "rear" roller and "back" roller refer herein to rollers that remain in contact with the holder to guide the latch or to position the latch by registration with detents on the holder. The latch assembly customarily pivots around a rigidly fixed post anchored to the wafer holder, and the assembly is usually held together by a helical spring. The body of the latch typically contains a slot which is engaged by actuator pins on a loading arm. The actuator pins are operated to rotate the latch through an arc of usually 90° to latch and unlatch the latches, moving the front roller into position against or retracted from the wafer. In addition to applying force for holding the wafer in place by urging the front roller against the wafer, the helical spring maintains the latch assembly in an upright position normal to the holder so that unobstructed engagement of the actuator pins with slots in the latch can occur.

When the latches are rotated, they slide against stationary wear shims which are biased by the force of the latch spring.

The latched and unlatched positions of a typical latch are defined by three detents 90° apart. Three equal depth detents are typically provided on the surface of the holder into which the rollers of the latch assembly are pushed by the force of the spring, and a fourth detent, which is deeper, is provided closest to the edge of the wafer. The deeper detent allows the wafer engaging portion of the front roller to lower onto the wafer and apply positive pressure of the wafer against the tabs when the latches are in their latched positions. The body of the latch is typically made out of metal, usually stainless steel. The rollers are usually provided with a substantially smaller cross-sectional radius than the spherical radius of the detents in order to minimize traction resistance of the rollers. All mutually moving elements are also typically made out of metal such as stainless steel and employ sliding pairs with various degrees of frictional resistance.

In use, latch actuation is preceded by the loading of a wafer onto the wafer holder such that it rests against the tabs. Simultaneously, the actuator pins on the transfer arm engage the slots of each of the latches, with the rollers expected to be in full detent and the latches in their open or unlatched positions. While the wafer is held with the suction of a vacuum chuck or by some other clamping mechanism on the transfer arm, the latch actuator pins rotate the latches about their pivots. Both rollers of the latch rise out of and descend into a shallow pair of detents, thus pulling the latches into and keeping them in the desired orientations. However, when the front roller is latched onto the wafer, this function is performed only by the rear roller. Generous clearance between the pins and the slots is typical in order to avoid brushing of pins against the slots during the engagement, which is a frequent cause of wafer chipping. Due to such oversized slots, the latch rotation is always less than 100% that of the actuator pins. The force of the spring is expected to overcome frictional resistance of the sliding elements and to pull the rollers fully into the detents, thus completing 100% rotation.

Every time the edge of a misaligned slot is struck by an actuator pin of the transfer arm, the impact is transmitted to the front roller, which can cause a piece of wafer to be chipped away by the roller bearing against the wafer. This results in significant waste of devices and downtime for cleaning. In high vacuum, the use of a slot wider than the pins is not always effective. In many situations, high friction within the latch prevents the latch slot from being kept in alignment with the center of the actuator pins. However, misaligned slots may be due to something as simple as the tilt of the latch caused by a thin wafer. It is, however, more often found that incomplete positioning of the rollers in the detents is the cause of misaligned slots.

Many sliding joints in the design of the latch result in high frictional hysteresis within the latch mechanism, which makes the slot position and its subsequent engagement unpredictable and unstable. Friction among many mutually interacting surfaces are the factors influencing completeness and repeatability of the seating of the rollers in the detents, which is needed to bring the latches fully to their latched and unlatched positions. For example, residual friction between the rollers and the body of the latch can lead to a tilt of the latch. Friction from the rollers, combined with torsional friction between the body and the spring, contributes torsional resistance, which the latch spring is unable to overcome so as to be able to push the rollers fully into the detents. Consequently, less than complete rotation of the latch occurs providing insufficient clamping, particularly of very thin wafers, allowing them to slide on the holder and providing misalignment of the actuator pins with their slots, thereby allowing them to strike the latch bodies instead of entering the slots. If stronger springs are used to overcome such incomplete latch rotation, more wear is generated and the front roller can be caused to snap onto the wafer, which can shatter thinner wafers.

Furthermore, the friction coefficients of materials increase many times in vacuum, and the wear of most materials at temperatures of above 600° C. significantly increases, causing non-metals to abrade and metals to gall, causing highly undesirable particle generation, which causes defective fabrication of semiconductor devices or possibly misalignment of latches and resulting wafer clipping.

Rollers of the prior art also present problems. Small cross-sectional radii of usually identical front and rear rollers contribute to wear, especially at elevated temperatures, which alter the trajectory of the front roller. If the cross-sectional radius of a roller is not identical to that of the spherical radius of the detents, contact stresses increase when rollers roll into and out of the detents. Metallic rollers provided on metallic shafts in ultra-high vacuum of, for example, more than $10^{-8}$ Torr, are subject to phenomenon known as "cold welding", which causes metal-to-metal pairs to stick together. Where front rollers do not roll but, rather, slide, they gouge the rolling surface of the base and also rub the wafer and either score or shift the wafer out of alignment.

Prior art uses of so called soft ceramics, for example, MACOR, produce low friction but exhibit very poor wear properties and do not possess required structural integrity where contact stresses are high, thus rendering them unsuitable as highly moveable parts in particle conscious applications. Rollers made out of these materials are easily dented from the slightest snap into a detent, and, as a result, they must be frequently replaced due to the excessive wear of the shafts and roller surfaces and the formation of dents and flats on the gripping surfaces. Excessive wear of the front roller surfaces and insides of detents alters the trajectory of the front roller causing the front roller to roll over the edge of the wafer rather than to descend gently onto the wafer. Rolling over the edge of the wafer is the major cause for the wafer shift.

The material of which the front roller is formed and that comes into contact with the wafer has been of paramount importance in the art from a process point of view. While hard ceramics, in general, are available with only minute traces of sodium, the soft machinable ceramics such as MACOR contain, in addition to high content of sodium, potassium and fluorine which are totally unacceptable elements for some critical processes of semiconductor devices.

It has also been found that the cross-sectional shape of the wafer-contacting portion of the front roller has direct impact on wafer chipping and particle generation. With rounded edge rollers, the tangent point of wafer contact can move close to the edge of the wafer where it is more likely to cause the wafer to chip. On the other hand, a cylindrical roller can cause the roller to roll onto an edge, which can also generate particles by crumbling the edges of the wafer or the roller.

The phenomenon of cold welding also occurs when the concentrated force of the metal spring is applied against a thin metal shim, and against the metal latch in high vacuum, resulting in a very high friction coefficient. Higher spring force must be used to overcome this friction force, causing excessive wear of the joint, generation of particles and failure to maintain accurate detent because of high residual latching torque. Further, resulting torsion on the spring causes the inner sides of the coils to rub against the post, increasing wear and leading to potential spring failure.

Front metal rollers, which are part of a metal latch used on tab wafer holders, are exposed to direct deposition in a coating process. Some deposited materials (TiN, W, TiW) tend to flake off and jam the rollers, requiring frequent acid cleaning to keep particulate count down. In systems which use tab wafer holders, the backside gas easily floods the gaps around the wafer and the latch cavities, which can frequently ignite secondary plasma during etching or RF-bias sputtering. This situation not only generates large amount of particulates, but it is also a source for re-sputtering of unwanted material onto the wafers.

In the case of backside sputtering, that is, where it is necessary to sputter a film onto the side of the wafer opposite the device side, which leaves the semiconductor devices facing into the backplane, the gap between the wafer and the backplane must be small enough to provide good thermal coupling between the wafer and the backplane yet, at the same time, be large enough to avoid semiconductor devices from coming into contact with the backplane. With the wafer latched against a tab ring rigidly mounted to the wafer holder housing, both the wafer holder and the backplane are sealed against same reference surface, which does not provide for the "growth" of the backplane as a result of thermal expansion. Depending on the temperature of the backplane, the wafer gap may vary significantly and impact the process results or completely close, causing damage to the devices on the wafer.

For the reasons stated above and for other reasons, there remains a need for a better method and apparatus for holding wafers for processing and for latching and releasing wafers from wafer holders.

SUMMARY OF THE INVENTION

It is an objective of the present invention to provide a high vacuum processing apparatus with improved wafer clamping in a processing chamber. It is another objective of the present invention to reduce the production of particles that can lead to substrate contamination in semiconductor wafer vacuum processing, particularly in the transfer of wafers between a transfer arm and a wafer holder within a vacuum processing chamber. Further objectives of the present invention are to overcome each of the specific problems of the prior art set forth above. It is a particular objective of the invention to provide a wafer holder that will clamp a wafer at high temperatures.

According to the principles of the present invention there is provided a semiconductor wafer processing apparatus having wafer holder formed of a rigid annular housing with a wafer mounting ring having an annular wafer engaging surface on the inner edge of the back side thereof. The ring is resiliently mounted on its back side to the housing at a plurality of points around the housing so that the ring translates toward and away from the housing without making sliding contact with the housing. The holder includes a plurality of at least three latch assemblies each having a non-metallic latch body pivotally and resiliently mounted to the mounting ring so as to be biased toward the mounting ring. The body is pivotally mounted to the back side of the mounting ring on a mounting post fixed and perpendicular to the back side of the mounting ring to rotate through approximately 90° between a latched position and an unlatched position when actuated.

In the preferred embodiment of the invention, each latch assembly has a non-metallic front roller rotatable on the body about an axis perpendicular to and intersecting the mounting post. The front roller has a gripping periphery at its outer end, which lies adjacent the wafer engaging surface of the mounting ring when the latch assembly is rotated to its latched position, and a rolling periphery at its inner end, which rolls in a circle around the mounting post on the back side of the wafer mounting ring. At least one non-metallic rear roller is also provided, which is rotatable on the body about an axis perpendicular to and intersecting the mounting post. The rear roller has a rolling periphery, preferably approximately equal to the rolling periphery of the front roller, which rolls on the same circle as the rolling periphery of the front roller. A plurality of detents is provided on the back side of the wafer mounting ring on the circle on which the rolling peripheries of the rollers move. The detents are preferably of the same diameter as the rolling peripheries of the rollers and receive the rolling peripheries of the rollers when the latch assembly is in the unlatched position or in the latched position to retain the latch assemblies in the respective positions.

Preferably, the wafer mounting ring is resiliently mounted on its back side to the housing at a plurality of six points approximately equally spaced around the housing, with a set of three approximately equally spaced leaf springs and a set of three approximately equally spaced coil springs supporting the ring on the housing with one spring being mounted at each of the six points to bias the ring toward the housing. Preferably also, a spring loaded ball bearing joint is provided at each mounting post for biasing the latch assembly toward the mounting ring and rotatably connecting the latch assembly to the mounting ring for rotation about the mounting post. Each mounting post is removable for removing the latch assembly as a unit from the mounting ring.

Further, the gripping periphery of the front roller is preferably provided with an outwardly diverging conical axial cross-section with rounded edges. The rolling periphery of the front roller is preferably also greater than its gripping periphery, and the rear roller is preferably rotatable about the same axis, and through the mounting post as the front roller with the rolling periphery of the rear roller approximately equal to the rolling periphery of the front roller. The plurality of detents in the back side of the wafer mounting ring preferably includes a pair of side detents on opposite sides of the mounting post to receive the rolling peripheries of the front and rear rollers when the latch assembly is in an unlatched position and a front and back detent adapted to receive the rolling peripheries of the respective front and rear rollers when the latch assembly is in a latched position. Preferably, the side and rear detents have equal depths and the front detent has a greater depth such that the rolling periphery of the front roller is seated in the front detent only when the latch assembly is in a latched position with no wafer in the holder.

The apparatus also preferably includes a circular backplane centered on the axis of the housing and dimensioned to fit through the housing and in close proximity to the backside of a wafer held between the latches and the wafer mounting ring. A spacer is also provided, preferably on the backplane to form, with the mounting ring, a pair of spacing control surfaces that engage to function as a stop, which provides a predetermined space between the backside of the wafer and the backplane.

The apparatus also has a load arm with a wafer chuck thereon that is relatively moveable perpendicular to a plane of the wafer holder and in a path through the center of the holder between a rearward position on the backside of the holder outside of the chamber and a forward position at which a wafer held in the chuck is in contact with the clamping member. A plurality of latch actuators supported on the load arm is provided, one corresponding to and aligned with each of the latch assemblies. The actuators each have a plurality of pins configured and located so as to fit loosely into the recesses in the latch body upon movement of the load arm to a forward position and are relatively moveable into and out of a coupling engagement with the latch assemblies when the load arm moves between its forward and rearward positions. The actuators are rotatable, when coupled to the bodies of the latch assemblies, to rotate the latch assemblies between their latched and unlatched positions.

With the present invention, a wafer holder is provided with latch assemblies that function reliably at high vacuums and high temperatures. Such a holder has a positive economic impact on semiconductor wafer manufacturing processes by reducing wafer breakage, requiring lower maintenance and reducing downtime of the processing equipment. Smooth and friction-free operation of the latch further improves yield by lowering the number of particles present to contaminate the wafer.

These and other objectives of the present invention will be more readily apparent from the following detailed description of the invention.

DETAILED DESCRIPTION OF THE PREFERRED EMBODIMENT

An example of a wafer handling and holding mechanism for the processing of wafers in a vertical orientation is described and illustrated in U.S. Pat. No. 4,915,564, hereby expressly incorporated herein by reference. In that system, individual wafers are gripped on their back surfaces by vacuum chucks on a transfer arm and transferred device side first through the door of a loadlock chamber of a processing apparatus. The arm moves the wafer against tabs on a clamping ring carried by the wafer holder in the loadlock, whereupon a plurality of latches, three in number spaced at even intervals around the periphery of the holder, move behind the wafer to clamp the wafer between the latches and the clamping ring tabs. To avoid sliding friction of the latches across the backs of the wafers, the latches have rollers at the tips which roll onto the wafer back surface into a latching position while applying a force to the wafer that is resisted by the clamping ring tabs. The latches are held in their latching positions by spherical spring loaded detents so that the latches do not move out of their latching positions after the loading arm chucks have disengaged the wafer and the loading arm is withdrawn from the loadlock. The detents hold the latches in position for the additional reason that the latches must be positioned for engagement by latch actuators on the loading arm when the arm is returned to the loadlock chamber to remove the wafer after processing.

Figure 1:
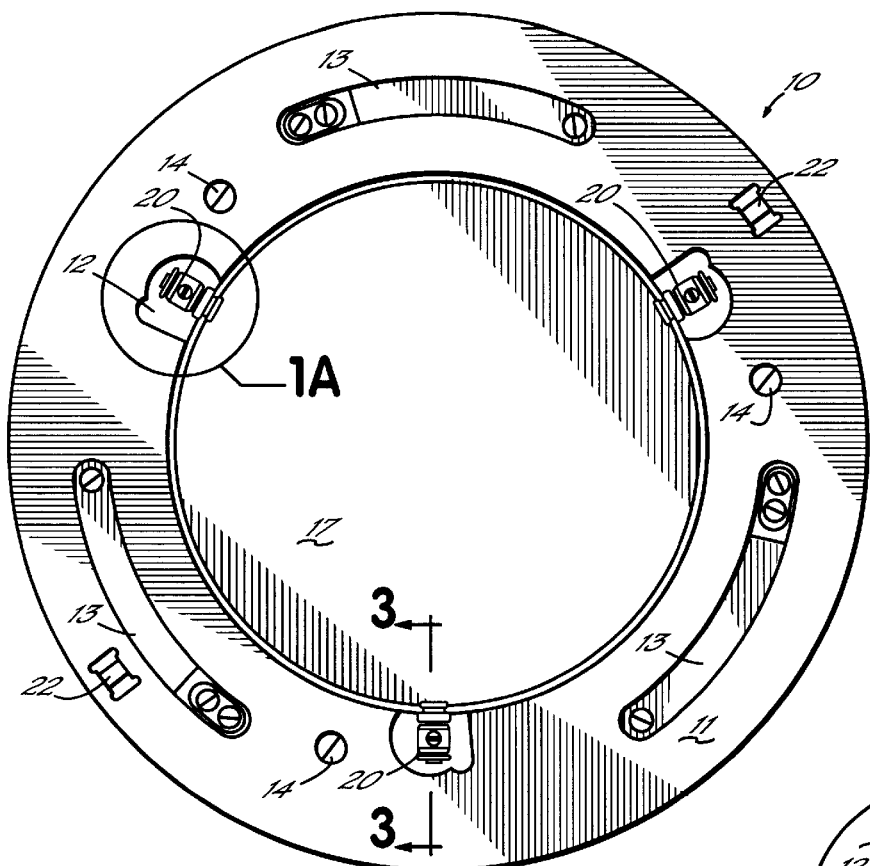
FIG. 1 is a backside view of a wafer holder embodying principles of the present invention.
Figure 1A:
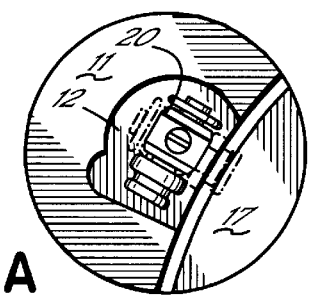
FIG. 1A is an enlargement of the portion marked "1A" of FIG. 1, in which the latches are illustrated in their latched conditions, but illustrating the latches in their unlatched conditions.

Referring to FIG. 1, one preferred embodiment of a wafer holder 10 according to the present invention is illustrated. The holder 10 includes an annular housing 11 to which a wafer mounting ring 12 is resiliently attached by an array of springs that include a set of three equally spaced leaf springs 13 and a set of three equally spaced conical coil springs 14, arranged so that the leaf and coil springs alternate around the holder 10. The springs 13 and 14 function to uniformly urge the mounting ring 12 toward and against the holder 11.

Pivotally mounted to the mounting ring 11 at equally spaced intervals around the holder 10 are three latch assemblies 20. The latch assemblies 20 are configured to rotate through approximately 90° between latched positions in which two of the latch assemblies 20 are illustrated in FIG. 1, and unlatched positions in which the other one of the latch assemblies 20 is illustrated in FIG. 1. The latch assemblies 20 are recessed into cutouts in the housing 11 and the mounting ring 12 forms a seal with the backplane to isolate the latch assemblies 20 from the plasma and prevent the ignition of secondary plasma within the latch cavities and around the wafer.

While the latch assemblies 20 are illustrated in different positions in FIG. 1, they are so presented to facilitate the understanding of their motion. In practice, the three latches will be moved in unison between their latched and unlatched positions by a latch actuator mechanism (not shown). The construction of the latch actuator mechanism is more particularly described in the commonly assigned and copending U.S. patent application Ser. No. 08/827,690, filed Apr. 10, 1997, now U.S. Pat. No. 5,820,329, issued Oct. 13, 1998, and expressly incorporated herein by reference and in U.S. Pat. No. 4,915,564 referred to above.

Figure 2:
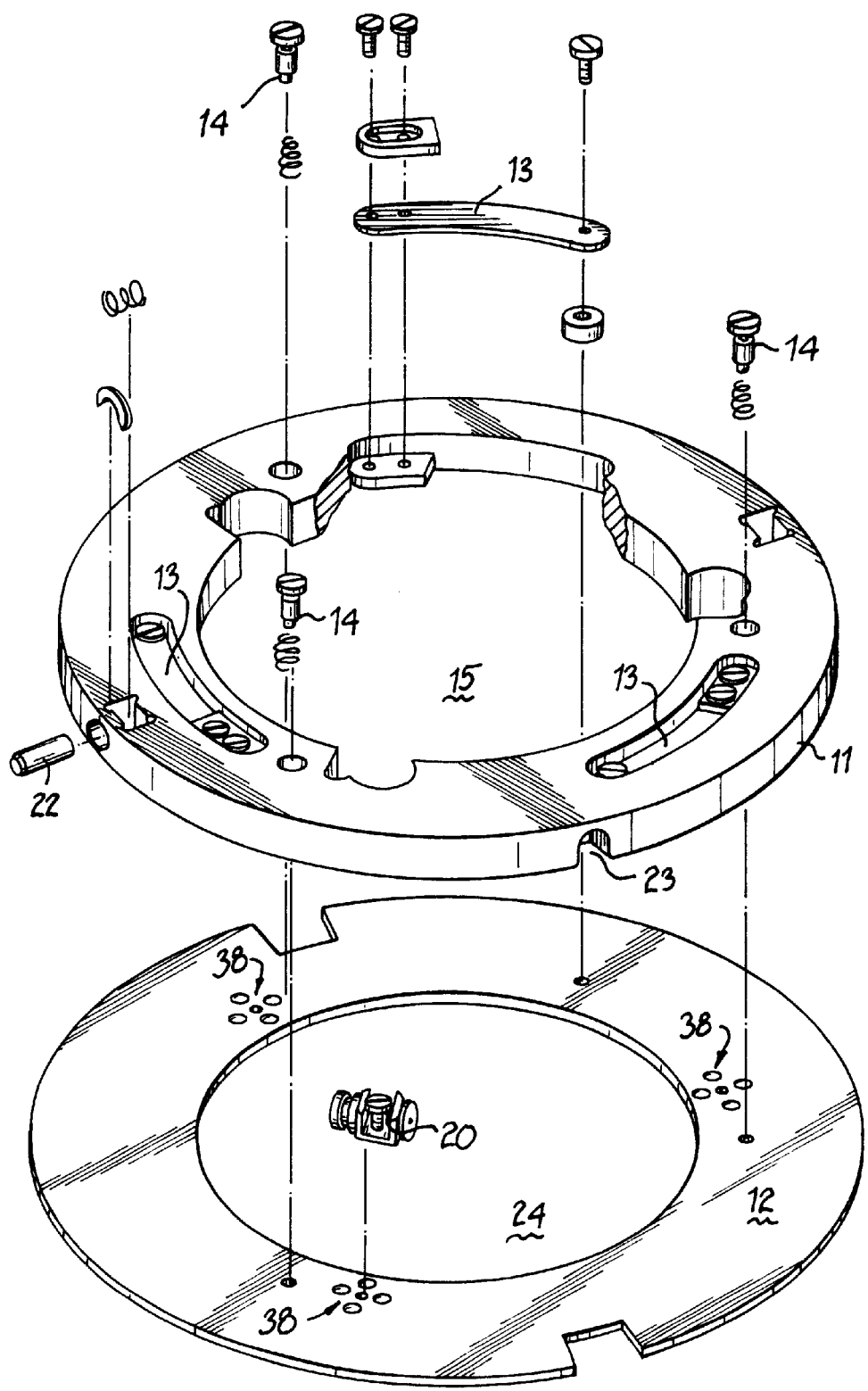
FIG. 2 is an exploded perspective view of the wafer holder of FIG. 1.

In a processing apparatus, the holder 10 is mounted to a carrier or index plate that positions the holder 10 among processing stations of the processing machine. The holder 10 is held to the index plate by one fixed pin carried by the plate and two spring-loaded pins 22 carried by the housing 11 of the wafer holder 10, more particularly illustrated in FIG. 2. The fixed pin of the plate is received by a notch 23 in the housing 11 while the spring loaded pins are received by radial recesses in the edge of an opening of the index plate.

The wafer mounting ring 12 has a circular opening 24 therein that is slightly smaller than a wafer 17 that is to be held the holder 10 for processing. As a result, the ring 12 has an inner annular surface 25 against which the edge of the wafer 17 rests when it is being held by the holder 10. The housing 11 has an opening 15 in its center that is larger than the wafer 17 that is to be held in the holder 10 for processing. Such a wafer 17 is inserted by a wafer transfer arm to which the wafer 17 is held by a chuck, for example a vacuum chuck, through the opening 15 until its outer edge lies in contact with the surface 25. The movement of the wafer 17 against the surface 25 may move the ring 12 slightly away from the housing 11 against the force exerted by the springs 13 and 14.

Figure 3:
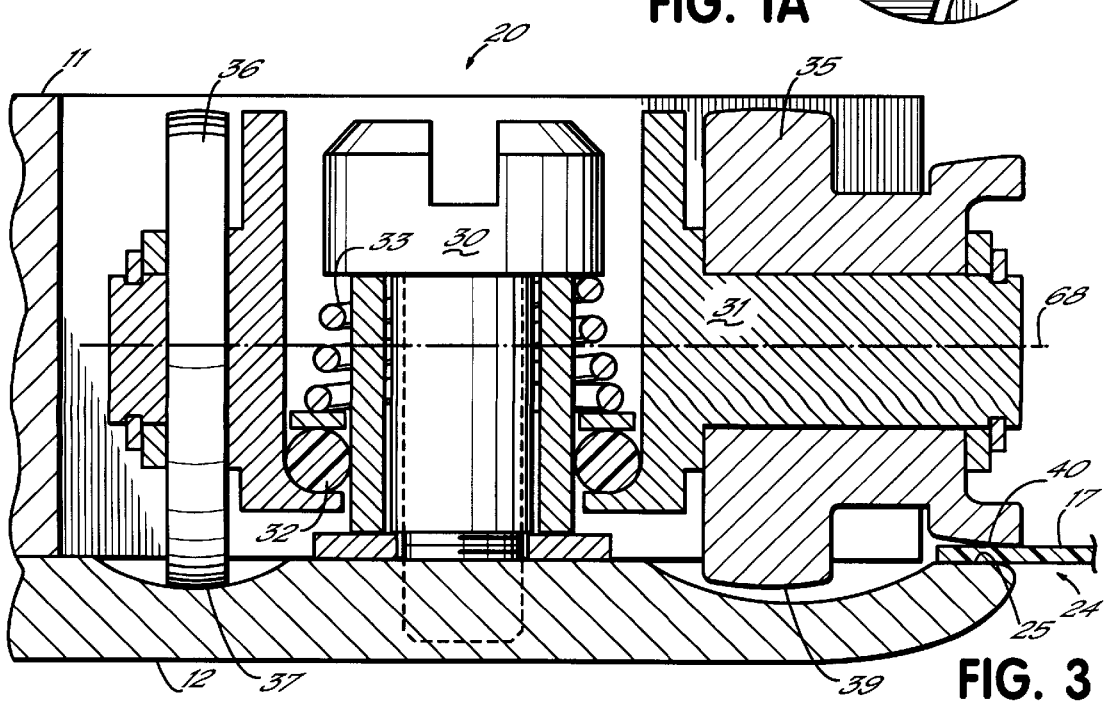
FIG. 3 is a cross-sectional view, taken along line 3—3 of FIG. 1, of a latch assembly of wafer holder of FIGS. 1 and 2.

When moved by the actuators to their latched positions, as illustrated in more detail in FIG. 3, the latch assemblies 20 clamp edge of the wafer 17 against the annular surface 25 around the opening 24 in the wafer holding ring 12. Each latch assembly 20 is pivotally mounted to the ring 12 at a mounting post 30 fixed to the ring 12. The post 30 is configured to attach to and release from the ring 12 so as to permit the latch assembly 20 to be removed as an assembled unit from the ring 12. The latch assembly 20 includes a non-metallic latch body 31 formed of a material such as high purity zirconia. The body 31 is pivotally mounted on the post 30 through a tungsten carbide ball bearing 32, and is biased against the mounting ring 12 by a conical spring 33 that surrounds the mounting post 30. The latch bodies 31 each have a pair of actuator pin receiving slots (not shown) therein, equally spaced from the mounting post 30, to receive actuator pins of the actuator mechanism on the transfer arm. These slots are oversized to insure engagement by the actuator pins, At opposite ends of the latch body 31 are rotatably mounted a pair of non-metallic rollers, including a front roller 35 and a back roller 36, both rotatable about an axis 68 that is parallel to the mounting ring 12 and intersects the centerline of the mounting post 30 approximately at a right angle.

The back roller or rear roller 36 has a rolling periphery 37 on which the roller 36 rolls in a circle 38 around the mounting post 30 as the latch assembly is pivoted by the latch actuator. The rolling periphery 37 has a surface that lies on the surface of a sphere. The front roller 35 also has a rolling periphery 39 that is of the same diameter as the rolling periphery of the back roller 36 and is also spherical. The rolling periphery 37 of the back roller 36 is spaced on the body 31 at the same distance from the mounting post 30 as the rolling periphery 39 of the front roller 35, so that the rolling peripheries 37,39 of the rollers 35,36 move on the same circle 38 on the back surface of the mounting ring 12.

The front roller 35 of each latch assembly 20 has a gripping periphery 40 on the outer end of the roller 35 spaced farther from the mounting post 30 than the rolling peripheries 37,39 of the rollers 36,35. The gripping periphery 40 is of smaller diameter than the rolling peripheries 37,39 and, as a result, does not contact the back surface of the mounting ring 12 when the latch body 31 is rotated by the actuators to the latched position. If there is a wafer 17 resting on the annular surface 25 on the back side of the mounting ring 12, the gripping periphery 40 is dimensioned to contact the back side of the wafer 17 and latch the wafer 17 between the gripping periphery 40 of the front roller 35 and the annular surface 25 on the mounting ring 12, as illustrated in FIG. 3. The gripping periphery 40 of the front roller 35 is an outwardly flared conical surface that is tapered so that only the outer edge contacts the wafer 17 regardless of the thickness of the wafer 17, thus maintaining repeatable latching trajectory of the gripping periphery 40 of front roller 35 from and onto the mounting ring surface and onto and off of the wafer 17. The inner and outer edges of the gripping periphery 40 are rounded to avoid concentrated loading of the wafer 17 when contacted by the front roller 35.

To hold the latch assemblies 20 stable in latched and unlatched positions when the actuators are not engaged with the latch bodies 31, a set of four detents is provided around the circles 38 on the back side of the mounting ring 12. Three of these detents, including a back detent 42 and a pair of side detents 43, are the same depth and size, and of the same spherical shape and diameter as the rolling peripheries 37,39 of the back and front rollers 36,35. The fourth detent is a front detent 44, which is of the same spherical shape and diameter as the rolling peripheries 37,39, but is of greater depth and size. As such, the rolling periphery 39 of the front roller 35 only fully seats in the front detent 44 if there is no wafer 17 on the mounting surface 25 of the mounting ring 12. If a wafer 17 is present on the surface 25, the gripping periphery 40 of the front roller 35 of the latches rolls onto the back surface of the wafer 17 and prevents the rolling periphery 39 from dropping into the detent 44 when the front roller 35 is centered on the detent 40. If the latch body 31 were to rotate slightly out of the latched position, the rolling periphery 39 of the front roller 35 would nonetheless engage the side walls of the front detent 44 thereby assisting the rear roller 36 in preventing the latch body 31 from rotating further out of its latched position.

Figure 3A:
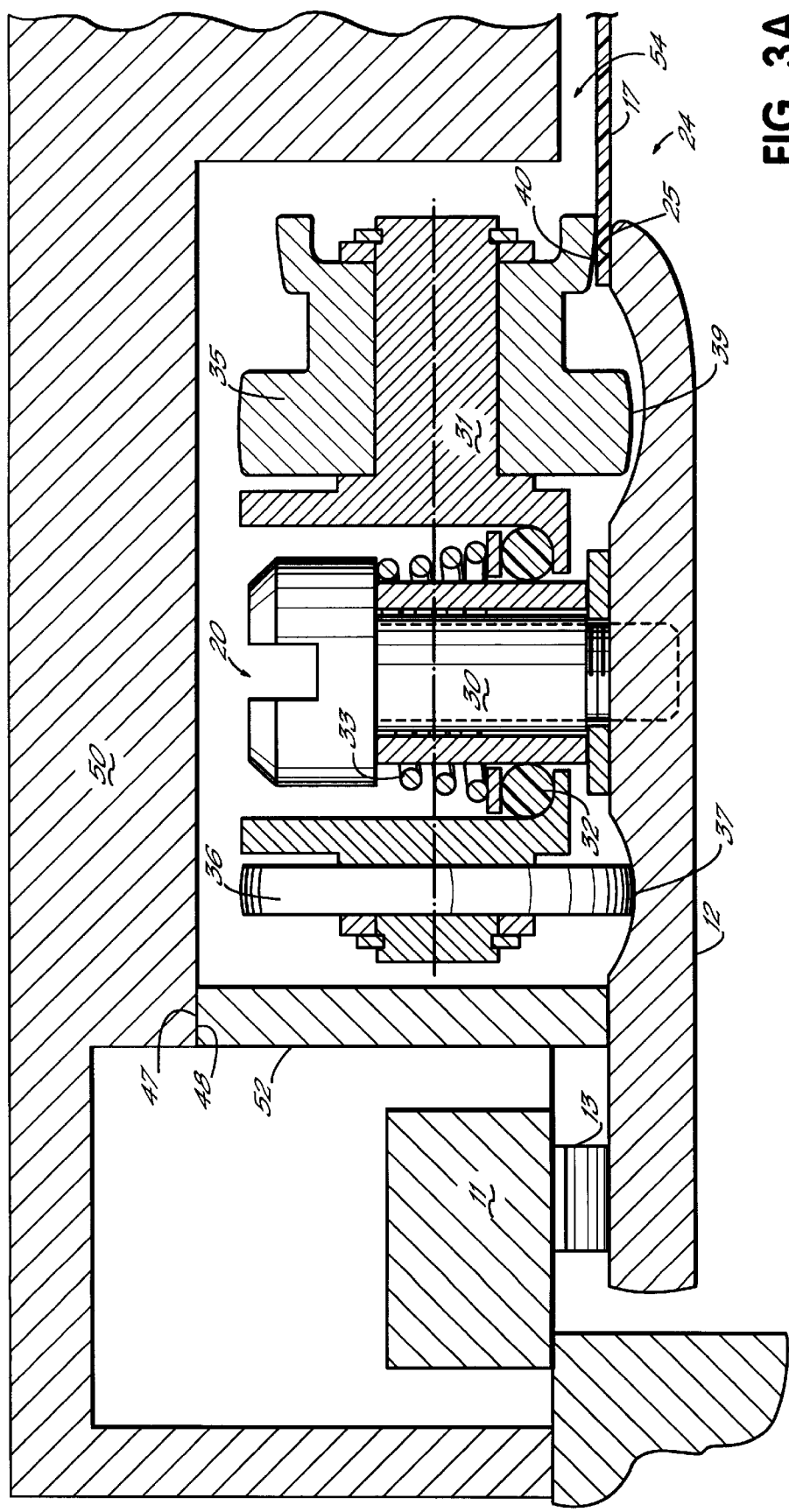
FIG. 3A is a cross-sectional view of an embodiment of the wafer holder of FIGS. 1–3 that is particularly useful for backside processing.

When the holder 10 is used to process the back sides of wafers 17, the front side of the wafer 17, which may have partially formed devices on the side thereof, is facing a backplane 50. To prevent contact between the device side of such a wafer 17 and the backplane 50, a pair of abutting contact surfaces 47,48 is provided, as illustrated in FIG. 3A. Preferably, one surface is carried on a stop 52 extending from, for either the mounting ring 12 or the backplane 50, to hold the mounting ring 12 away from the backplane 50 and allow a gap 54 to be maintained between the wafer 17 and the backplane 50.

Those skilled in the art will appreciate that the applications of the present invention herein are varied, and that the invention is described in preferred embodiments. Accordingly, additions and modifications can be made without departing from the principles of the invention.

What is claimed is:

1. A wafer holder for a semiconductor processing apparatus comprising:

a rigid annular housing having a central axis and an open center;

a wafer mounting ring having a back side, having an inner edge, and a front side and an annular wafer engaging surface on the inner edge of its back side, the ring being centered on the axis and resiliently mounted on its back side to the housing at a plurality of points around the housing so that the ring translates toward and away from the housing without making sliding contact with the housing;

a plurality of at least three latch assemblies each pivotally mounted to the back side of the mounting ring around the axis, each latch assembly having:

a mounting post fixed and perpendicular to the back side of the mounting ring, a non-metallic latch body pivotally and resiliently mounted to the mounting ring at the mounting post so as to be biased toward the mounting ring and rotatable through approximately 90° between a latched position and an unlatched position;

a non-metallic front roller rotatable on the body about an axis perpendicular to and intersecting the mounting post, the front roller having a gripping periphery which lies adjacent the wafer engaging surface of the mounting ring when the latch assembly is rotated to its latched position and a rolling periphery which lies on a circle around the mounting post on the back side of the wafer mounting ring, and at least one non-metallic rear roller rotatable on the body about an axis perpendicular to and intersecting the mounting post, the rear roller having a rolling periphery lying on the circle; and a plurality of detents in the back side of the wafer mounting ring lying on said circle to receive the rolling peripheries of the front and rear rollers when the latch assembly is in the unlatched position and the latched position.

2. The wafer holder of claim 1 wherein:

the wafer mounting ring is centered on the axis and resiliently mounted on its back side to the housing at a plurality of six points approximately equally spaced around the housing.

3. The wafer holder of claim 2 further comprising:

a set of three approximately equally spaced leaf springs and a set of three approximately equally spaced coil springs, one spring being mounted at each of the six points, to bias the ring toward the housing.

4. The wafer holder of claim 1 wherein each mounting post includes:

a spring loaded ball bearing joint biasing the latch assembly toward the mounting ring and rotatably connecting the latch assembly to the mounting ring for rotation about the mounting post.

5. The wafer holder of claim 1 wherein:

each mounting post is releasable for removing the latch assembly as a unit from the mounting ring.

6. The wafer holder of claim 1 wherein:

each latch assembly has a non-metallic latch body having a plurality of oversize actuator pin receiving slots therein equally spaced around the mounting post.

7. The wafer holder of claim 1 wherein:

the gripping periphery has an outwardly diverging conical axial cross-section with rounded edges.

8. The wafer holder of claim 1 wherein:

the rolling periphery is greater than the gripping periphery.

9. The wafer holder of claim 1 wherein:

the rear roller is rotatable about the axis of the front roller.

10. The wafer holder of claim 1 wherein:

the rolling periphery of the rear roller is approximately equal to the rolling periphery of the front roller.

11. The wafer holder of claim 1 wherein:

the plurality of detents in the back side of the wafer mounting ring include a pair of side detents on opposite sides of said mounting post to receive the rolling peripheries of the front and rear rollers when the latch assembly is in an unlatched position and a front and back detent adapted to receive the rolling peripheries of the respective front and rear rollers when the latch assembly is in a latched position.

12. The wafer holder of claim 1 wherein:

the rolling periphery of the rear roller is approximately equal to the rolling periphery of the front roller; and the plurality of detents in the back side of the wafer mounting ring include a pair of side detents on opposite sides of said mounting post to receive the rolling peripheries of the front and rear rollers when the latch assembly is in an unlatched position and a front and back detent adapted to receive the rolling peripheries of the respective front and rear rollers when the latch assembly is in a latched position, the side and rear detents having equal depths and the front detent having a greater depth such that the rolling periphery of the front roller is seated in the front detent only when the latch assembly is in a latched position with no wafer in the holder.

13. A semiconductor wafer processing apparatus comprising a vacuum chamber having therein a wafer holder according to of claim 1.

14. The apparatus of claim 13 further comprising:

a load arm having a wafer chuck thereon and relatively moveable perpendicular to a plane that is parallel to the axis in a path through the center of the housing between a rearward position on the back side of the holder outside of the vacuum chamber and a forward position at which a wafer held in the wafer chuck is in contact with the wafer mounting ring and is a space distance forward of the plane and at which the wafer mounting ring is spaced forward of the holder and is resiliently biased rearwardly against a wafer when the wafer is being held by the wafer chuck;

the body having an actuator pin receiving structure thereon around the mounting post, a plurality of latch actuators supported on the load arm, one corresponding to and aligned with each of the latch assemblies, the actuators having a plurality of surfaces thereon configured and located so as to engage the actuator pin receiving structure on a latch body upon movement of the load arm to its forward position being relatively moveable into and out of coupling engagement with the latches when the load arm moves respectively to its forward and rearward positions, and the actuators being rotatable, when coupled to the bodies of the latch assemblies, to rotate the latch assemblies between their latched and unlatched positions.

15. A wafer holder for a semiconductor processing apparatus comprising:

a rigid annular housing having a central axis;

a wafer mounting ring having a back side having an inner edge and a front side and an annular wafer engaging surface on the inner edge of the back side thereof, the ring being centered on the axis and resiliently mounted on its back side to the housing at a plurality of six points approximately equally spaced around the housing to translate toward and away from the housing without making sliding contact with the housing;

a set of three approximately equally spaced leaf springs and a set of three approximately equally spaced coil springs, one spring being mounted at each of the six points, to bias the ring toward the housing;

a set of three latch assemblies each pivotally mounted to the back side of the mounting ring and equally spaced around the axis, each latch assembly having a mounting post fixed and perpendicular to the back side of the mounting ring and having a spring loaded ball bearing joint biasing the latch assembly toward the mounting ring and rotatably connecting the latch assembly to the mounting ring for rotation about the mounting post, each mounting post being releasable for removing the latch assembly as a unit from the mounting ring, each latch assembly being rotatable through approximately 90° between a latched position and an unlatched position;

each latch assembly having:

a non-metallic latch body having a plurality of oversize actuator pin receiving slots therein equally spaced around the mounting post, a non-metallic front roller rotatable on the body about an axis perpendicular to and intersecting the mounting post, the front roller having:

a gripping periphery which lies adjacent the wafer engaging surface of the mounting ring when the latch assembly is rotated to its latched position and having an outwardly diverging conical axial cross-section with rounded edges, and a rolling periphery greater than the gripping periphery and which lies adjacent a circle around the mounting post on the back side of the wafer mounting ring, a non-metallic rear roller rotatable on the body about the axis of the front roller perpendicular to and intersecting the mounting post, the rear roller having a rolling periphery approximately equal to the rolling periphery of the front roller and which lies adjacent the same circle around the mounting post on the back side of the wafer mounting ring, and a plurality of detents in the back side of the wafer mounting ring lying on said circle, including a pair of side detents on opposite sides of said mounting post to receive the rolling peripheries of the front and rear rollers when the latch assembly is in an unlatched position and a front and back detent adapted to receive the rolling peripheries of the respective front and rear rollers when the latch assembly is in a latched position, the side and rear detents having equal depths and the front detent having a greater depth such that the rolling periphery of the front roller is seated in the front detent only when the latch assembly is in a latched position with no wafer in the holder.

16. The wafer holder of claim 15 further comprising:

a circular backplane centered on the axis of the housing and dimensioned to fit through the housing and in close proximity to the backside of a wafer held between the latches and the wafer mounting ring; and a pair of spacing control surfaces, one on the housing and one on the backplane, to form a stop which provides a predetermined space between the backside of the wafer and the backplane.

17. A semiconductor wafer processing apparatus comprising:

a load chamber;

a wafer holder in the chamber having:

a rigid annular housing having a central axis and a center, a wafer mounting ring having a back side having an inner edge and a front side and an annular wafer engaging surface on the inner edge of the back side thereof, the ring being centered on the axis and resiliently mounted on its back side to the housing at a plurality of points around the housing so that the ring translates toward and away from the housing without making sliding contact with the housing, a plurality of at least three latch assemblies each pivotally mounted to the back side of the mounting ring around the axis, each latch assembly having:

a mounting post perpendicular to the back side of the mounting ring, a non-metallic latch body pivotally and resiliently mounted to the mounting ring at the mounting post so as to be biased toward the mounting ring and rotatable through approximately 90° between a latched position and an unlatched position, the body having a plurality of oversize actuator pin receiving recesses therein equally spaced around the mounting post, a non-metallic front roller rotatable on the body about an axis perpendicular to and intersecting the mounting post, the front roller having a gripping periphery which lies adjacent the wafer engaging surface of the mounting ring when the latch assembly is rotated to its latched position and a rolling periphery which lies on a circle around the mounting post on the back side of the wafer mounting ring, and at least one non-metallic rear roller rotatable on the body about an axis perpendicular to and intersecting the mounting post, the rear roller having a rolling periphery approximately equal to the rolling periphery of the front roller and lying on said circle; and a plurality of detents in the back side of the wafer mounting ring lying on said circle to receive the rolling peripheries of the rollers when the latch assembly is in the unlatched position an the latched position;

a load arm having a wafer chuck thereon and relatively moveable perpendicular to a plane that is parallel to the axis in a path through the center of the housing between a rearward position on the back side of the holder outside of the vacuum chamber and a forward position at which a wafer held in the wafer chuck is in contact with the wafer mounting ring and is a spaced distance forward of the plane and at which the wafer mounting ring is spaced forward of the holder and is resiliently biased rearwardly against a wafer when the wafer is being held by the wafer chuck;

a plurality of latch actuators supported on the load arm, one corresponding to and aligned with each of the latch assemblies, the actuators having a plurality of pins thereon configured and located so as to fit loosely into the recesses in the latch body upon movement of the load arm to its forward position being relatively moveable into and out of coupling engagement with the latches when the load arm moves respectively to its forward and rearward positions; and the actuators being rotatable, when coupled to the bodies of the latch assemblies, to rotate the latch assemblies between their latched and unlatched positions.

18. A wafer holder for a semiconductor processing apparatus comprising:

a rigid annular housing having a central axis;

a wafer mounting ring having a back side having an inner edge and a front side and an annular wafer engaging surface on the inner edge of its back side, the ring being centered on the axis and resiliently mounted on its back side to the housing at a plurality of points around the housing so that the ring translates toward and away from the housing without making sliding contact with the housing;

pivotal latching means mounted to the back side of the mounting ring, including:

a non-metallic latch body;

a non-metallic front roller rotatable on the body and having a gripping periphery which lies adjacent the wafer engaging surface of the mounting ring when the latching means is rotated to a latched position and a rolling periphery in rolling contact with the back side of the wafer mounting ring, and at least one non-metallic rear roller rotatable on the body in rolling contact with the back side of the wafer mounting ring; and means for retaining the latching means is in its latched or an unlatched position.

19. A method of supporting semiconductor wafer in a processing apparatus, the method comprising the steps of:

providing a wafer holder having a wafer mounting ring resiliently mounted thereon in the vacuum chamber;

providing a plurality of latches rotatably mounted to the wafer mounting ring;

moving a wafer on a transfer arm against the mounting ring;

then rotating the latches with actuators on the transfer arm to bring a first rolling surface on the latches into rolling contact with the wafer and to grip the wafer between the rollers and the mounting ring;

then releasing the wafer from the transfer arm and to the holder; and the latch rotating step including the step of maintaining rolling contact between a second rolling surface of the latches and the mounting ring while simultaneously moving each of the latches from a stable unlatched position on the ring to a stable latched position on the ring.

20. A latch assembly for a wafer holder having a wafer mounting ring with an annular wafer engaging surface on a inner edge thereof, the assembly comprising:

a non-metallic latch body configured to pivotally mount to the wafer holder at a mounting axis perpendicular thereto;

a mounting post centered on the mounting axis and configured to removably pivotally connect the latch body assembly to the wafer holder;

a non-metallic front roller rotatable on the body and having a gripping periphery positioned to clamp a wafer against the wafer engaging surface of the mounting ring when the latching assembly is rotated to a latched position and having a rolling periphery situated between the gripping periphery and the mounting axis and positioned to lie in rolling contact with the wafer holder when the latch body is connected thereto by the mounting post;

at least one non-metallic rear roller rotatable on the body and having a rolling periphery configured to lie in rolling contact with the wafer holder when the latch body is connected thereto by the mounting post;

the non-metallic front roller being rotatable on the body about a transverse axis perpendicular to and intersecting the mounting axis; and the at least one non-metallic rear roller being rotatable on the body about the transverse axis and is located opposite the mounting axis from the front roller, the rolling peripheries of the front and rear rollers being equidistant from the mounting axis and the gripping periphery being at a greater distance from the mounting axis than are the rolling peripheries.

21. The latch assembly of claim 20 further comprising:

a spring loaded ball bearing joint for biasing the latch assembly toward the wafer holder and rotatably connecting the latch assembly to the wafer holder for rotation about the mounting post.

22. The latch assembly of claim 20 wherein:

the gripping periphery has an outwardly diverging conical axial cross-section with rounded edges.

23. The latch assembly of claim 20 wherein:

the peripheries each have a circular circumference, the circumference of the rolling periphery of the front roller being greater than the circumference of the gripping periphery.

24. The latch assembly of claim 20 wherein:

the rolling peripheries each have a circumference, the circumference of the rolling periphery of the rear roller being approximately equal to the circumference of the rolling periphery of the front roller.

25. A wafer mounting ring assembly comprising:

a wafer mounting ring having a back side, having an inner edge, and a front side and an annular wafer engaging surface on the inner edge of its back side;

a plurality of at least three latch assemblies each pivotally mounted to the back side of the mounting ring around the axis, each latch assembly having:

a mounting post fixed and perpendicular to the back side of the mounting ring, a non-metallic latch body pivotally and resiliently mounted to the mounting ring at the mounting post so as to be biased toward the mounting ring and rotatable through approximately 90° between a latched position and an unlatched position;

a non-metallic front roller rotatable on the body about an axis perpendicular to and intersecting the mounting post, the front roller having a gripping periphery which lies adjacent the wafer engaging surface of the mounting ring when the latch assembly is rotated to its latched position and a rolling periphery which lies on a circle around the mounting post on the back side of the wafer mounting ring, and at least one non-metallic rear roller rotatable on the body about an axis perpendicular to and intersecting the mounting post, the rear roller having a rolling periphery lying on the circle; and a plurality of detents in the back side of the wafer mounting ring lying on said circle to receive the rolling peripheries of the front and rear rollers when the latch assemblies are in their unlatched positions or the latched positions.

26. The wafer mounting ring of claim 25 wherein:

each mounting post includes a spring loaded ball bearing joint biasing the latch assembly toward the mounting ring and rotatably connecting the latch assembly to the mounting ring for rotation about the mounting post.

27. The wafer mounting ring of claim 25 wherein:

each mounting post is releasable for removing the latch assembly as a unit from the mounting ring.

28. The wafer mounting ring of claim 25 wherein:

each latch assembly has a non-metallic latch body having a plurality of oversize actuator pin receiving slots therein equally spaced around the mounting post.

29. The wafer mounting ring of claim 25 wherein:

each gripping periphery has an outwardly diverging conical axial cross-section with rounded edges.

30. The wafer mounting ring of claim 25 wherein:

the rolling peripheries are greater than the gripping peripheries.

31. The wafer mounting ring of claim 25 wherein:

the rear rollers are rotatable about the axes of the front rollers.

32. The wafer mounting ring of claim 25 wherein:

the rolling peripheries of the rear rollers are approximately equal to the rolling peripheries of the front rollers.

33. The wafer mounting ring of claim 25 wherein:

the plurality of detents in the back side of the wafer mounting ring includes a pair of side detents on opposite sides of said mounting post to receive the rolling peripheries of the front and rear rollers when each latch assembly is in an unlatched position and a front and back detent adapted to receive the rolling peripheries of the respective front and rear rollers when each latch assembly is in a latched position.

34. The wafer mounting ring of claim 25 wherein:

the rolling peripheries of the rear rollers are approximately equal to the rolling peripheries of the front rollers; and the plurality of detents in the back side of the wafer mounting ring include a pair of side detents on opposite sides of said mounting post to receive the rolling peripheries of the front and rear rollers when each latch assembly is in an unlatched position and a front and back detent adapted to receive the rolling peripheries of the respective front and rear rollers when each latch assembly is in a latched position, the side and rear detents having equal depths and the front detent having a greater depth such that the rolling periphery of the front roller is seated in the front detent only when the latch assembly is in a latched position with no wafer in the holder.

* * * * *

UNITED STATES PATENT AND TRADEMARK OFFICE
CERTIFICATE OF CORRECTION

PATENT NO. : 6,143,147
DATED : November 7, 2000
INVENTOR(S) : Vaclav Jelinek

It is certified that error appears in the above-identified patent and that said Letters Patent is hereby corrected as shown below:

<u>Column 14,</u>
Line 4, reads "in the unlatched position an the latched position" and should read -- in the unlatched position and the latched position --.

Signed and Sealed this

Thirtieth Day of October, 2001

*Attest:*

*Nicholas P. Godici*

*Attesting Officer*

NICHOLAS P. GODICI
*Acting Director of the United States Patent and Trademark Office*